United States Patent [19]

Hill et al.

[11] Patent Number: 4,485,342

[45] Date of Patent: Nov. 27, 1984

[54] LOAD DRIVING CIRCUITRY WITH LOAD CURRENT SENSING

[75] Inventors: William D. Hill; Dennis W. Hollenbeck, both of San Jose, Calif.; Kenneth M. Schor, Sudbury, Mass.

[73] Assignee: General Electric Company, San Jose, Calif.

[21] Appl. No.: 402,373

[22] Filed: Jul. 27, 1982

[51] Int. Cl.³ .................... H02J 3/00; H01H 47/28
[52] U.S. Cl. .................... 323/351; 323/350; 323/285; 323/909; 361/153; 361/196
[58] Field of Search .................. 323/282–285, 323/290, 268, 271, 349–351, 909; 361/152–154, 203, 204, 209, 195–196

[56] References Cited

U.S. PATENT DOCUMENTS

| | | | |
|---|---|---|---|
| 3,439,229 | 4/1969 | Ingle | 361/153 |
| 3,638,074 | 1/1972 | Inouye | 361/204 |
| 3,809,998 | 5/1974 | Mansson | 323/282 |
| 3,995,177 | 11/1976 | Sirocka et al. | 323/283 X |
| 4,027,228 | 5/1977 | Collins | 323/282 |
| 4,170,740 | 9/1979 | Pernyeszi | 307/251 |
| 4,256,979 | 3/1981 | Hendrickson et al. | 323/351 X |

FOREIGN PATENT DOCUMENTS 280841  8/1979  Fed. Rep. of Germany.

OTHER PUBLICATIONS

Arthur D. Evans et al., "High Power Rating Extend V-MOS FET's Domain," Electronics, Vol. 51, No. 13, Jun. 22, 1978, pp. 105–112.

Primary Examiner—Peter S. Wong
Attorney, Agent, or Firm—Ivor J. James, Jr.; Samuel E. Turner; Raymond G. Simkins

[57] ABSTRACT

A testable load driving circuit apparatus includes a solid-state load driver for controlling AC current loads coupled in series with a winding of a saturable core reactor used for sensing the presence or absence of load current through a load current monitor which is coupled to another winding in the reactor. The load driving circuitry may be tested during circuit operation by injecting a signal of insufficient duration to substantially affect the load circuit.

9 Claims, 1 Drawing Figure

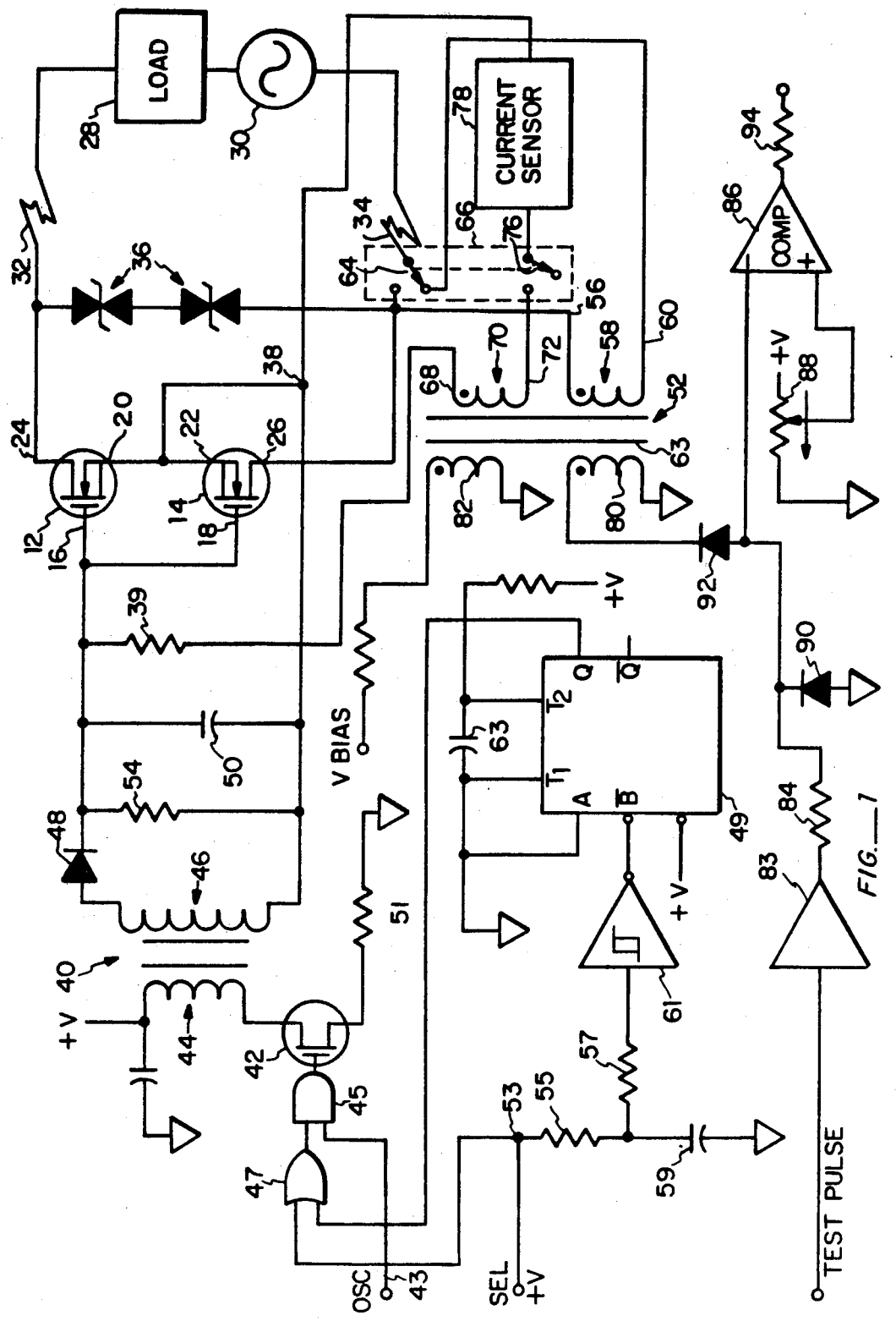
FIG._1

LOAD DRIVING CIRCUITRY WITH LOAD CURRENT SENSING

BACKGROUND OF INVENTION

1. Field of Invention

This invention relates to instrumentation and particularly to instrumentation and control in an environment requiring accurate and continuous monitoring during operation. In particular, this invention relates to an apparatus for switching high current inductive loads while monitoring the status of load circuitry. A particular application of this invention is in the drive of an AC controlled field solenoid connected at a distance of up to about one-half mile from the control source as in the environment of an operating nuclear power plant. The invention has other applications where relatively high current levels are controlled by standard logic level signals and where mechanical contact relays are insufficiently reliable in the operational environment.

Certain control functions require the use of relatively high level AC current in circuits having wire lengths of up to one mile or more. The relatively lengthy, high current circuits present special control problems. For example, the lengthy circuits are subject to unwanted high voltage and high current transients due both to the external environment and to the inductance in the circuit. There is nevertheless, the need to measure accurately the current in the driven circuit from a remote location.

2. Description of the Prior Art

In the past, high current load driving circuits have been controlled with low level logic signals through the use of DC circuitry and mechanical contact relay circuits. Reliability and noise immunity are significant concerns in such designs. Moreover, mechanical relays inherently have only a finite life. Frequent testing of a relay circuit causes the relay contacts to degrade, thereby degrading the reliability of the circuit. In addition, testing procedures are such that a relay must be removed from its normal circuit for testing to avoid effect on the load. Degradation caused by self-testing is generally unacceptable in an environment requiring high reliability.

SUMMARY OF THE INVENTION

A circuit apparatus comprises a solid-state load driver for controlling AC current loads which may be coupled in series with a winding saturable-core reactor for sensing the presence or absence of load current. The load current and the load current monitor are both under control of relatively low level logic signals. Output circuitry provides a high level of isolation between the low level control logic circuitry and the high level current driving circuitry. The load driving circuitry can be tested by use of short-duration injecting signal testing techniques without degrading the load driving circuitry, and current can be sensed with negligible effect on the load circuit.

The invention will be better understood by reference to the following detailed description taken in connection with the accompanying drawing.

DESCRIPTION OF THE DRAWING

FIG. 1 is a schematic diagram of a load driving circuit and current monitor according to the invention.

DESCRIPTION OF SPECIFIC EMBODIMENTS

Turning to FIG. 1, the load driving and current sensing circuitry according to the invention comprises a pair of HEXFETS 12, 14 having common coupled gate electrodes 16 and 18, common coupled source electrodes 20, 22 and drain electrodes 24, 26 coupled across a load 28 which is in series with a power source 30 through a relatively long signal paths 32, 34. The signal paths 32, 34 may be formed by a twisted pair wire, typically on the order of 800 meters long. The load 28 is typically a field winding of an electro-mechanical solenoid. The power source 30 is typically an AC power supply, although a DC power supply may be used. Coupled across the drain electrodes 24, 26 is a diode clipping network 36. The clipping network 36 serves to suppress unwanted transients which may develop on the signal paths 32, 34, but it is not necessary to normal and proper operation of the circuitry. The HEXFETS 12, 14 are threeterminal field effect transistors which are capable of conducting both AC signals and DC signals in the inventive circuit configuration. Type IRF350 N-channel type field effect transistors manufactured by International Rectifier of Los Angeles, Calif. are preferred device choices. The source terminals 20, 22 are coupled to a common node 38, and the drain electrodes 24, 26 are coupled in series with the load 28 and an AC power source 30, such as 120 volts 60 Hz power source 30 in series with the load 28.

HEXFET-type devices 12, 14 are chosen because of their high current capability and very low on resistance, typically in the range of 0.3 ohms each when forward biased.

The load driving circuit is driven through a transformer 40 from an oscillator circuit including a field effect transistor (FET) 42 coupled across the primary windings 44 of the transformer 40. The oscillator circuit operates at about 100 kHz from an oscillator input 43 to an AND gate 45 driving the FET 42. A secondary winding 46 is coupled through a rectifier diode 48 operative in a half wave rectifier circuit. The rectified half wave DC voltage is filtered by capacitor 50 across the secondary winding 46 in parallel with a loading resistor 54 across which a DC voltage is developed when the oscillator circuit is operating. The common node 38 of the source electrodes is coupled to one terminal of the filter capacitor 50. The source electrodes 20, 22 are only required in the driving circuitry since the gate electrodes 16, 18 are driven by their own isolated and rectified DC power under control of an oscillator driving the primary winding 44 of the transformer 40.

The oscillator input 43 is gated to the FET 42 only in the presence of either a select input pulse from a select input at node 53 through an OR gate 47, generally having a duration of about 1 msec, or a latched input pulse on a line 51 from a noninverting output Q of a monostable multivibrator 49. The duration of such a latched signal is as long as is required by the load. A typical duration is approximately 100 msec.

The select input line at node 53 is employed to provide both test input signals and function input signals. Function input signals are routed through an RC low pass filter network consisting of resistors 55 and 57 and capacitor 59, the signal being fed through resistor 57 to an input terminal of a Schmitt trigger 61. The Schmitt trigger 61 is intended to guard against input jitter thereby to prevent false triggering of the multivibrator 49. A signal having a duration of at least 1 msec, and generally on the order of 5 msec, is propagated through the Schmitt trigger 61 to the monostable multivibrator 49 to arm a timing capacitor 63 and to enable the OR gate 47 through logic signal line 51 for the duration of the time delay established by timing capacitor 63. In this manner, the load driving circuitry can be tested with a 1 msec test pulse, activating the oscillator through AND gate 45 for a short, i.e., 1 msec, test without having to arm the multivibrator 49 for the full duration of the load driving function.

One of the features of this circuitry is an ability to measure current consistently and reliably without disrupting or otherwise degrading intended functional operation. For this purpose, according to the invention, there is provided a sensing transformer 52, which is a saturable core transformer, to detect the presence of gate drive potentials or output load current. More specifically, a tape-wound core 63 is employed in the transformer 52 with a first terminal 56 of a load sensing winding 58 coupled to the drain electrode 26 and a second terminal 60 coupled through in series with the load 28. A first switch 64, or hard wire connection, is used for routing the current through the load. Alternatively, a high impedance resistor 39 connected to the gate electrodes 16, 18 is coupled to one terminal 68 of a second transformer winding 70, the other terminal 72 of which is coupled to a current sensor 78. Connection may be through a second switch 76 as part of a ganged switching arrangement 66 with first switch 64. The transformer 52 may thus serve both functions as a gate current sensor and a load current sensor. Alternatively the second winding 70 may be hard wired to the current sensor 78. In an alternative embodiment, separate transformers and pickups may be employed for gate current and load current sensing, so the ganged switch 66 may be eliminated and both sensing operations may be carried out simultaneously.

The state of current through the sensing transformer 52 is monitored by a test winding 80. A bias winding 82 prebiases the sensing transformer 52 to a desired current level approaching saturation. Bias is selected so that increased current to either the load sensing winding 58 or the gate sensing winding 70 drives the core 63 into saturation, thereby allowing high current to flow through the test winding 80 whenever a voltage is applied thereto.

Voltage to the test winding 80 is applied by means of a test pulse, generally on the order of 1 msec in duration, through a buffer 83 and current limiting resistor 84 coupled to first input node of a comparator 86. The second input node of the comparator 86 is coupled to a level setting potentiometer 88. A first diode 90 across the comparator input prevents the test line from going negative. A second diode 92 in series with the test winding 80 provides isolation against undesired negative pulses. In operation, a test pulse of 1 msec duration is applied through the buffer 83 and thereby to the test winding 80. If the core 63 is not saturated, thereby indicating the presence of current through the load, the test winding 80 presents a high impedance and thereby a logic high voltage signal to the input of the comparator 86. The level is sensed by the comparator 86 and conveyed as a logic output signal through a system output resistor 94, whose voltage level is strobed approximately 800 microseconds after the application of an input test pulse. If, on the other hand, the core 63 is saturated, the test winding will present a low impedance to ground pulling the sensing input of the comparator 86 toward ground. This level is sensed by the comparator and presented as a logic level signal through the output resistor 94. Upon strobe of the system output after 800 microseconds, the different logic level will be detected and recognized as an indication of the presence of current. This output indication will be a logic one, assuming positive logic.

The invention has now been explained with reference to specific embodiments. Other embodiments will be apparent to those of ordinary skill in this art. It is therefore not intended that this invention be limited except as indicated by the appended claims.

We claim:

1. A circuit apparatus for driving a load in response to logic control signals, said circuit apparatus comprising: field effect transistor means, said field effect transistor means responsive to input logic level signals for switching on and off an alternating current power source, said field effect transistor means being connected in series with said power source and said load, said power source and said load defining a load means having a first terminal and a second terminal, said field effect transistor means comprising a first field effect transistor having a first gate electrode, a first source electrode and a first drain electrode, and a second field effect transistor having a second gate electrode, a second source electrode and a signal drain electrode, said first gate electrode being common coupled with said second gate electrode and said first source electrode being common coupled with said second source electrode, said first drain electrode being coupled to said first terminal of said load means, and said second drain electrode being coupled to said second terminal of said load means thereby to form a switched circuit for alternating current through said field effect transistor means, said first and second field effect transistors being responsive for switching to changes in voltage potential from said common coupled first and second source electrodes to said common coupled first and second gate electrodes.

2. The circuit apparatus according to claim 1 further including gate-source circuit means for generating input logic level signals, said gate-source circuit means comprising a gating circuit coupled to an oscillator for gating an oscillator signal, means coupled to said gating circuit for rectifying said oscillator signal, said rectifying means being coupled to provide a DC signal between said first and second gate electrodes and said first and second source electrodes in response to gating signals.

3. A circuit apparatus according to claim 1 or 2 further including sensing means for monitoring operation of said field effect transistor means.

4. The circuit apparatus according to claim 3 wherein said sensing means comprises a first current sensing winding in a reactor having a readily saturable core, said first winding being coupled in series with said load means and said field effect transistor means for sensing current through said load means.

5. The circuit apparatus according to claim 3 wherein said sensing means comprises a second current sensing winding in a reactor having a readily saturable core, said second winding being coupled between said first and second gate electrodes and said first and second source electrodes for sensing current which develops a voltage between said gate electrodes and said source electrodes.

6. The circuit apparatus according to claim 4 wherein said sensing means further includes a current detecting circuit operative to detect for saturation of said reactor, said detecting circuit comprising a third current sensing winding on said core, a comparator and means for applying a test current to said third winding, said third winding exhibiting a high impedance in the absence of core saturation and exhibiting low impedance in the presence of core saturation.

7. The circuit apparatus according to claim 5 wherein said sensing means further includes a current detecting circuit operative to detect for saturation of said reactor, said detecting circuit comprising a third current sensing winding on said core, a comparator and means for applying a test current to said third winding, said third winding exhibiting a high impedance in the absence of core saturation and exhibiting low impedance in the presence of core saturation.

8. The circuit apparatus according to claim 2 wherein said gate-source circuit means further includes timing means responsive to an input pulse of at least a minimum duration for maintaining said gating circuit on for a preselected duration.

9. The circuit apparatus according to claim 8 further comprising means for injecting a test pulse to said gate-source circuit means and means for isolating test pulses applied by said test pulse injecting means from said timing means to prevent said timing means from latching said gate-source circuit means.

* * * * *